United States Patent [19]

Kleinberg

[11] 3,806,831

[45] Apr. 23, 1974

[54] ULTRA-STABLE OSCILLATOR WITH COMPLEMENTARY TRANSISTORS

[75] Inventor: Leonard L. Kleinberg, Greenbelt, Md.

[73] Assignee: The United States of America as represented by the Administrator of the National Aeronautics and Space Administration, Washington, D.C.

[22] Filed: Dec. 14, 1972

[21] Appl. No.: 315,069

[52] U.S. Cl. .......... 331/116 R, 331/108 A, 331/115, 331/159

[51] Int. Cl. .......... H03b 5/36, H03b 7/06

[58] Field of Search .......... 331/116 R, 117 R, 159, 331/115, 108 A

[56] References Cited

UNITED STATES PATENTS

| | | | |
|---|---|---|---|
| 3,475,698 | 10/1969 | Noe | 331/116 R X |
| 3,676,801 | 7/1972 | Musa | 331/116 R |

*Primary Examiner*—Herman Karl Saalbach
*Assistant Examiner*—Siegfried H. Grimm
*Attorney, Agent, or Firm*—R. F. Kempt; John R. Manning

[57] ABSTRACT

A high frequency oscillator, having both good short and long term stability, is formed by including a piezoelectric crystal in the base circuit of a first bi-polar transistor circuit, the bi-polar transistor itself operated below its transitional frequency and having its emitter load chosen so that the input impedance, looking into the base thereof, exhibits a negative resistance in parallel with a capacitive reactance. Combined with this basic circuit is an auxiliary, complementary, second bi-polar transistor circuit of the same form as the first bi-polar transistor circuit, with the piezoelectric crystal being common to both circuits. By this configuration, variations in the input impedance of the first bipolar transistor, resulting from changes in the transitional frequency due to small changes in quiescent current, are substantially cancelled by opposite variations in the second bi-polar transistor circuit, thereby achieving from the oscillator a signal having its frequency of oscillation stable over long time periods as well as short time periods.

10 Claims, 2 Drawing Figures

ULTRA-STABLE OSCILLATOR WITH COMPLEMENTARY TRANSISTORS

ORIGIN OF THE INVENTION

The invention described herein was made by an employee of the United States Government and may be manufactured and used by or for the Government of the United States of America for governmental purposes without the payment of any royalty thereon or therefor.

BACKGROUND OF THE INVENTION

The invention relates to a stable oscillator circuit, and more particularly to such a circuit having both short term and long term frequency stability.

Balloon borne data collection systems typically require low cost, easily reproducible oscillators which exhibit extremely stable oscillations both for short periods, in the order of 30–90 seconds, and for long periods in excess of 15 minutes. At the present time, neither the stability nor the ease of reproducibility requirements can be easily met by conventional oscillators, except possibility by those of very complex design and in which the cost thereof would be prohibitive for the application intended.

U.S. Pat. No. 2,769,908 to Stansel does suggest an inexpensive, stable, crystal controlled, negative resistance oscillator circuit having short term frequency stability. Experimental use of this circuit has shown, while it is capable of extremely stable short term oscillations (1 part in $10^9$ to 2 parts in $10^{10}$ for 30–90 seconds), that it, however, does not posess inherent long term stability (1 part in $10^8$ or greater for periods greater than 15 minutes). In fact, stability of 1 part in $10^8$ was not achieved for periods significantly less than 15 minutes.

BRIEF SUMMARY OF THE INVENTION

It is therefore apparent that a need exists for an inexpensive, easily reproducible, oscillator circuit having both short term and long term frequency stability. The primary object of the instant invention is to provide such a novel oscillator circuit.

It is a further object of the present invention to provide an ultra-stable oscillator adaptable to integrated circuit techniques and which can operate at a desired discrete frequency in a 100 KC to 120 MC frequency range.

It is still another object of the present invention to provide an exceptionally stable oscillator which is particularly suitable for use as a master oscillator in satellites, in frequency synthesizer applications, in frequency measuring equipment, and as a frequency standard.

These objects, as well as others which will become apparent as the description proceeds, are implemented by the novel invention which comprises a piezoelectric crystal connected in the base circuit of a first bi-polar transistor having its emitter load so chosen that the input impedance, looking into the base thereof, exhibits a negative resistance in parallel with a capacitive reactance. Combined therewith is a complementary, second bi-polar transistor having its base circuit connected to the piezoelectric crystal and being both in the same form and having its emitter load circuit substantially identical to the first bi-polar transistor. This complementary arrangement of substantially matched, complementary transistor stages functions to stabilize the oscillator against frequency drift since any variation in one stage, which would tend to cause a frequency drift, results in an opposite variation in the other stage, thereby substantially cancelling the frequency drift in said one stage. This same action of the two transistor stages provides the further advantage of reducing self modulation and non-linear harmonic generation.

BRIEF DESCRIPTION OF THE DRAWING

The invention itself will be better understood, and features and advantages thereof, in addition to those above-described, will become apparent from the following detailed description of the preferred inventive embodiment, such description making reference to the appended drawing wherein.

DETAILED DESCRIPTION OF THE PREFERRED EMBODIMENT

Figure 1:
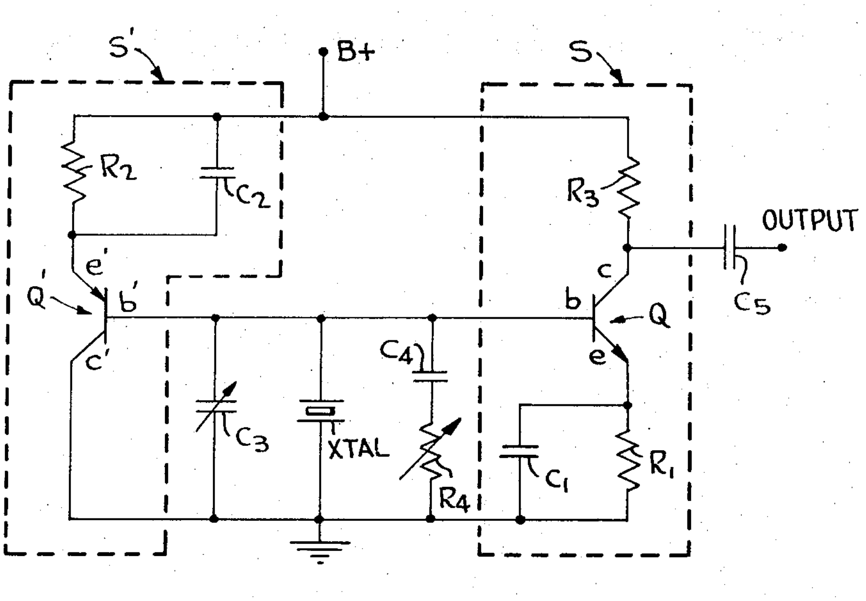
FIG. 1 is a schematic representation of the preferred embodiment of the inventive ultra-stable oscillator.

Referring now to the drawing, particularly to FIG. 1 thereof, the oscillator circuit is shown as including two matched, complementary, bi-polar transistors Q and Q′ being of the npn and pnp type, respectively, and having emitter, base, and collector electrodes, *e*, *b*, *c* and *e′b′c′*, respectively. Bases *b* and *b′*, of the two transistors, are connected in common; emitter *e* is connected by a parallel combination of emitter bias resistor $R_1$ and emitter capacitor $C_1$ to ground; emitter *e′* is connected by a parallel combination of emitter bias resistor $R_2$ and emitter capacitor $C_2$ to a source of B+ voltage; collector *c* is connected by resistor $R_3$, wherefrom the output is derived via capacitor $C_5$, to the source of B+ voltage; and collector *c′* is connected to ground. The description thus far has been directed to the general configuration of the two complementary transistors Q and Q′ with their electrode connections which, as shown enclosed by dashed lines in FIG. 1, form two transistor stages S and S′.

The oscillator circuit further includes three parallel, passive networks connected between the common bases *b*, *b′* and ground: the first being a series circuit of dc blocking capacitor $C_4$ and variable resistor $R_4$, the latter selected to compensate the negative resistance at the desired frequency; the second being a piezoelectric crystal XTAL to provide inductance for the oscillator circuit; and the third being a variable fine tuning capacitor $C_3$ for fine tuning the resonant circuit composed of piezoelectric crystal XTAL and the sum of the capacitances, Ceq and $C'_{eq}$ (expressed by equations (3) and (1), respectively, infra), seen looking into the transistor stages S and S′, respectively.

For the purpose of the discussion which will follow, directed to the transistor stages S and S′, $R_3$ (being very small in value, e.g., from 50 to 100 ohms) will generally not be considered as a part of transistor stage S, particularly, as it was placed in the collector circuit of transistor Q merely for the reason of taking the output therefrom via capacitor $C_5$. It should be understood that the output could be taken from various other places such as from resistor $R_1$. Should this latter situation be desired, resistor $R_3$ could be omitted without any change in the operation of the oscillator circuit.

With the oscillator circuit connected, as just described, transistor stage S, includes transistor Q, with its emitter circuit resistor $R_1$ and capacitor $C_1$; transistor stage S', includes transistor Q', with its emitter circuit resistor $R_2$ and capacitor $C_2$; capacitor $C_4$ serves as a dc blocking capacitor; variable resistor $R_4$ restricts the negative resistance by being adjusted to substantially balance the negative resistance; and the piezoelectric crystal XTAL, the capacitance, $C_{eq}$ and $C'_{eq}$ (expressed by equations (3) and (1), respectively, infra), seen looking into the transistor stages S and S', respectively, and fine turning capacitor $C_3$ determine the oscillator's operational frequency F.

Resistors $R_1$ and $R_2$, of transistor Q and Q', respectively, serve to bias the two transistors Q and Q', thereby determining the individual quiescent currents thereof. They are chosen so that the bias voltage at the common bases $b$, $b'$ is substantially equal to one half the voltage of the source of B+ voltage to insure symmetry of the resultant oscillator signal. Furthermore, they are generally selected to be substantially equal to each other and at least ten times greater than the reactance of the emitter capacitors $C_1$ and $C_2$. It should be understood, however, if the dc $\beta$'s (common emitter current gains) of the transistors Q and Q' are unequal, resistors $R_1$ and $R_2$ would not necessarily be equal but would rather be chosen such that the common base voltage would be one half the voltage of the source of B+ voltage.

The values of capacitors $C_1$ and $C_2$, in the emitter circuits of transistors Q and Q', respectively, are selected such that: (1) the resulting negative resistance is sufficient for the oscillator circuit requirements, and (2) the positive resistance, inherent in the piezoelectric crystal XTAL and the various capacitors of the oscillator circuit, are substantially canceled out.

Now, when power is furnished to the oscillator circuit of FIG. 1 by the source of B+ voltage, oscillations develop and thereafter are maintained since the impedance looking into the base circuit of either transistor will appear as a negative resistance in parallel with a capacitor. Final adjustment to the specific frequency F of oscillations is obtained by tuning fine tuning capacitor $C_3$ to its final value $C'_3$ and by adjusting variable resistor $R_4$ to compensate for excessive negative resistance. With the oscillator circuit so functioning and the element thereof properly tuned, the resultant total capacitance ($C'_3 + C_D$ as given in equation (7) infra), external to the piezoelectric crystal XTAL of the oscillator circuit, acts in conjunction with the piezoelectric crystal XTAL to form a resonant circuit at substantially the desired frequency F of the oscillator signal.

The particular connections of the two transistor sections S and S' with respect to each other result in each transistor stage acting as the bias circuit for the other. Accordingly, an increase in the quiescent current in one transistor section, which would tend to cause a drift in the oscillator frequency, is accompanied by a decrease in the quiescent current of the other transistor section, thereby substantially cancelling the drift in oscillator frequency. Further, by the selected biasing arrangement, the inherent limiting or clipping action, which is the cause of quiescent current change, is minimized since such limiting or clipping that occurs is symmetrical.

Figure 2:
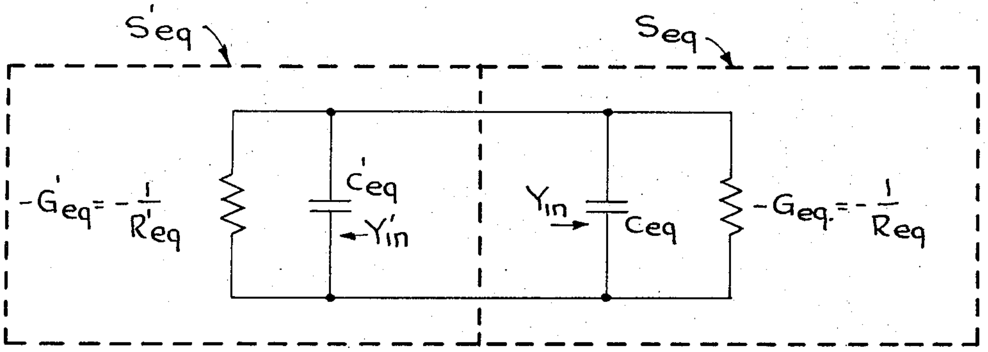
FIG. 2 is the equivalent circuit diagram of the two transistor stages of FIG. 1 being directly connected together.

Proof of the function of the two transistor sections S and S', in the manner just described, can be seen by reference to FIG. 2, which is the equivalent circuit of the combination of the two transistor stages, represented as $S_{eq}$ and $S'_{eq}$, respectively, operating below their respective transitional frequencies, with the transitional frequencies being $F_t$ and $F'_t$, respectively, where $F_t$ is substantially equally to $F'_t$. As used herein, transitional frequency is defined as the frequency at which the common emitter current gain $\beta$ of the transistor is unity.

Considering only the dominant terms (neglecting the effects of $R_1$, $R_2$, $R_3$ of the oscillator circuit of FIG. 1 and the internal parameters of the transistors) the dominant admittance, given in the form of equivalent capacitance and conductance, for the two equivalent transistor stages, $S'_{eq}$ and $S_{eq}$, is as follows:

Transistor Stage $S'_{eq}$ $$C'_{eg} = C_2/\overline{1+(F'_t/F)^2} \quad (1)$$

$$-G'_{eg} = -1/R_{eg} = 2\pi F'_t C_2/\overline{1+(F'_t/F)^2} \quad (2)$$

Transistor State $S_{eq}$ $$C_{eg} = C_1/\overline{1+(F_t/F)^2} \quad (3)$$

$$-G_{eg} = -1/R_{eg} = 2\pi F_t C_1/\overline{1+(F_t/F)^2} \quad (4)$$

Now, combining the equivalent capacitance and conductance terms, respectively, for the two equivalent transistor stages $S_{eq}$ and $S'_{eq}$ gives total equivalent capacitance $C_D$ and total equivalent conductance $C_D$ as follows:

$$C_D = C_1/\overline{1+(F_t/F)^2} + C_2/\overline{1+(F'_t/F)^2} \quad (5)$$

$$-G_D = -1/R_D = 2\pi F_t C_1/\overline{1+(F_t/F)^2} + 2\pi F'_t C_2/\overline{1+(F'_t/F)^2} \quad (6)$$

Referring again to FIG. 1, the frequency at which the oscillator will oscillate is given by the following expression:

$$F = F_s\sqrt{1 + C_s/(C'_3 + C_D)}, \quad (7)$$

Where:

$F_s$ is the series resonant frequency of piezoelectric crystal XTAL, $C_s$ is the series capacitance of crystal piezoelectric XTAL, $C'_3$ is the final value of capacitance of tuning capacitor $C_3$, $C_D$ is given by equation (5), and $C'_3 + C_D$ is defined as the total capacitance external to the piezoelectric crystal XTAL.

The piezoelectric crystal itself is operated in the inductive mode somewhere between its series and parallel resonant frequencies.

As can be seen from equations (5) and (6), $C_D$ is a function of the transitional frequencies $F_t$ and $F'_t$ of the two equivalent transistors stages $S_{eq}$ and $S'_{eq}$, respectively. Accordingly, any variations in these two transitional frequencies would tend to produce a change in $C_D$. Due to the dc biasing arrangement, it is possible to compensate for changes in $F_t$ by opposite changes in $F'_t$, thereby maintaining $C_D$ constant, and hence the frequency of oscillations F which depends on $C_D$, substantially constant over long time intervals.

Stated in another way, by virtue of the dc connections of the oscillator circuit of FIG. 1, an increase in quiescent current of one transistors is accompanied by a decrease in quiescent current of the other transistor. By this operation an increase in transitional frequency in one transistor is accompanied by a decrease in transitional frequency of the other transistor, thereby reducing the accumulative frequency drift that would occur if it were not for the circuit configuration of the instant invention. This configuration also results in symmetrical limiting or clipping of the resultant oscillator signal (rather than unsymmetrical limiting or clipping, as is the case with prior art negative resistance oscillators), thereby minimizing quiescent current changes.

The way in which variations in the transitional frequency occur is as follows. For example, if there is a change in the normal limiting or clipping action of the base signal, due to a change in frequency F, the average dc collector currents at the two transistors will tend to change, the current in one transistor increasing and the current in the other transistor decreasing. Because the transitional frequency of each transistor is a continuous function of the dc collector currents, $F_t$ and $F'_t$ will change in the same manner as the dc collector currents. With the two transistors being complementary and matched, i.e., having equal values of transitional frequency, the change in $F_t$ will be equal but be opposite to the change in $F'_t$. Consequently, with capacitor $C_1$ equal to capacitor $C_2$, the values of capacitance $C_D$ across the piezoelectric crystal XTAL will be maintained relatively constant. This may be seen by inspection of equations (5) and (6) supra. Changes in the two terms on the right hand side of the equations will cancel. Of course, if the transitional frequencies $F_t$ and $F'_t$ are not nominally equal, capacitors $C_1$ and $C_2$ would have to be chosen such that the value of capacitance $C_D$ will be maintained substantially constant.

It can be seen, if transistor stage S' of FIG. 1 was omitted, only one of the terms on the right hand side of equations (5) and (6) would appear, and variations in the transitional frequency would result in changes in the value $C_D$. Consequently, the oscillator frequency F, being a function of $C_D$, would not be maintained constant. Thus, by the inclusion of the transistor stage S' with transistor stage S, frequency stability over relatively long time intervals is obtained.

An added feature obtained by the configuration of FIG. 1 is the reduction of self-modulation, a source of harmonic generation. Since the amplitude of oscillations for the oscillator circuit and the change of currents at the collectors are all relatively large, each transistor has a modulated transitional frequency. However, as already described, since when one transistor is increasing in current the other is decreasing, self modulation is substantially reduced.

While not to be construed as limiting the present invention, excellent result were obtained with piezoelectric crystal XTAL designed for operation at 5.3 MC, in the inductive mode, the particular crystal XTAL being an AT cut piezoelectric crystal. It should be understood although at an cut piezoelectric crystal was used, that piezoelectric crystals having other cuts could also perform adequately. The other components of the circuit were as follows:

Q = 2N930 (npn) } matched pair of
Q' = 2N2605 (pnp) } complementary transistors
$R_1 = R_2 = 2.7K\Omega$
$R_3 = 50\text{–}100\Omega$
$R_4 = 1\text{–}10K\ \Omega$
$C_1 = C_2 = 100pf$
$C_3 = 8\text{–}45pf$
$C_4 = 1000pf$
$C_5 = 1000pf$
B+ = 12 volts dc Typically, at fixed temperatures, the oscillator circuit of FIG. 1 is capable of a short term stability of one part in $10^{10}$ and a long term stability of one part in $10^9$. At room temperature, the oscillator circuit containing the above referenced valued components operated at 5.3 MC with frequency change of only 2 parts in $10^7$ per 10 percent change of the source of B+ voltage.

It should be pointed out, by the proper selection of the piezoelectric crystal and the various other components of the oscillator, an extremely stable oscillator can be achieved for any discrete frequency within the range of frequencies of 100 KC to 120 MC. Moreover, the circuit can also be made to perform substantially as well (1 part in $10^6$ or greater) by substituting an appropriate valued inductor for piezoelectric crystal XTAL.

From the foregoing detailed description, it should therefore be apparent that all the objectives set forth at the outset of this specification have been successfully achieved. Moreover, while there has been shown and described a present preferred embodiment of the invention, it is to be distinctly understood by those skilled in the art that the invention is not limited thereto, but may otherwise be variously embodied and practiced within the scope of the following claims.

What is claimed is:

1. A stable high frequency oscillator having its frequency of oscillation stable over long time periods as well as short time periods comprising: a pair of complementary active stages including a first electron discharge device forming one of said pair of complementary active stages and a second electron discharge device forming the other of said pair of complementary active stages; means for creating a negative resistance and capacitive reactance in said pair of complementary stages including a pair of parallel circuits of bias resistor and capacitor, one of said pair of parallel circuits being connected with said first electron discharge device and the other of said pair of parallel circuits being connected with said second electron discharge device; and an inductive impedance element connected in common with said pair of complementary active stages.

2. The stable high frequency oscillator of claim 1 wherein said inductive impedance element is a piezoelectric crystal.

3. The stable high frequency oscillator of claim wherein said first electron discharge device is a bi-polar pnp transistor having a first transitional frequency; and said second electron discharge device is a bi-polar npn transistor having a second transitional frequency, where said first transitional frequency and said value of transitional frequency are substantially equal.

4. The stable high frequency oscillator of claim 3, further including an impedance means shunting said piezoelectric crystal.

5. The stable high frequency oscillator of claim 4, wherein said pair of stages further includes a source of dc potential having a positive terminal and a negative terminal; said pnp transistor has a collector, an emitter, and a base electrode; and said npn transistor has a collector, an emitter, and a base electrode; said base electrode of said pnp transistor connected in common with said base electrode of said npn transistor, a first one of said pair of parallel circuits of bias resistor and capacitor connector between said positive terminal of said source of dc potential and said emitter electrode of said pnp transistor, a second one of said pair of parallel circuits of bias resistor and capacitor connected between said collector electrode of said pnp transistor and said emitter electrode of said pnp transistor, said collector electrode of said npn transistor connected to said positive terminal of said source of dc potential, and said piezoelectric crystal connected between said base electrode and collector electrode of said pnp transistor, with said collector electrode thereof also being connected to said negative terminal of said source of dc potential.

6. The stable high frequency oscillator of claim 5, wherein said impedance means includes a parallel combination of a fine tuning capacitor with a variable resistor in series with a dc blocking capacitor.

7. The stable high frequency oscillator of claim 6, wherein the capacitance values of the capacitors of said pair of parallel circuits of bias resistor and capacitor are substantially equal.

8. The stable high frequency oscillator of claim 7, wherein the values of the bias resistors of said pair of parallel circuits of bias resistor and capacitor are chosen such the bias voltage at said base electrode of said npn transistor is substantially equal to one half the voltage of said source of dc potential.

9. The stable high frequency oscillator of claim 8 wherein said values of said bias resistors are substantially equal and each is at least ten times greater than the capacitive reactance of the capacitor with which it is shunting.

10. The stable high frequency oscillator of claim 5, further including a resistor, wherefrom the output of said oscillator is derived, connecting said collector electrode of said npn transistor to said source of dc potential.

* * * * *